United States Patent [19]

Whitefoot

[11] Patent Number: 4,775,805

[45] Date of Patent: Oct. 4, 1988

[54] DIFFERENTIAL FREQUENCY SIGNAL GENERATOR

[76] Inventor: Alan D. Whitefoot, 7620 29th W., Tacoma, Wash. 98466

[21] Appl. No.: 14,025

[22] Filed: Feb. 12, 1987

[51] Int. Cl.$^4$ .................. H03L 7/00; H03K 19/00
[52] U.S. Cl. .................................. 307/271; 307/479; 307/471; 328/15; 328/140
[58] Field of Search ............ 307/471, 269, 479, 529, 307/528, 271; 328/15, 14, 17, 140, 30, 59, 133, 62; 377/47, 48, 46, 124; 331/51, 53, 37, 41, 46

[56] References Cited

U.S. PATENT DOCUMENTS

| | | | |
|---|---|---|---|
| 3,914,590 | 10/1975 | Irwin et al. ........................ | 307/471 |
| 3,916,324 | 10/1975 | Shuda ............................... | 307/269 |
| 3,993,957 | 11/1976 | Davenport ........................ | 377/47 |
| 4,669,099 | 5/1987 | Zinn ................................. | 307/271 |
| 4,689,577 | 8/1987 | Vreeken et al. .................. | 307/269 |

FOREIGN PATENT DOCUMENTS 0070665 4/1983 Japan ..................................... 377/47

OTHER PUBLICATIONS

Lancaster, "CMOS Cookbook", 1977, Indianapolis, Indiana, pp. 178–180, 325–330.
Hernandez, Jr., "Frequency Multiplier Using Delay", IBM Tech. Dis. Bulletin, vol. 26, No. 3A, Aug. 83, pp. 990–991.

Primary Examiner—Stanley D. Miller
Assistant Examiner—Timothy P. Callahan

[57] ABSTRACT

Frequency translation circuitry consisting of a delay circuit, a digital register, an XOR gate and digital frequency dividers which provides output signals differing in frequency by a specific amount determined by the frequency of only one input signal.

10 Claims, 4 Drawing Sheets

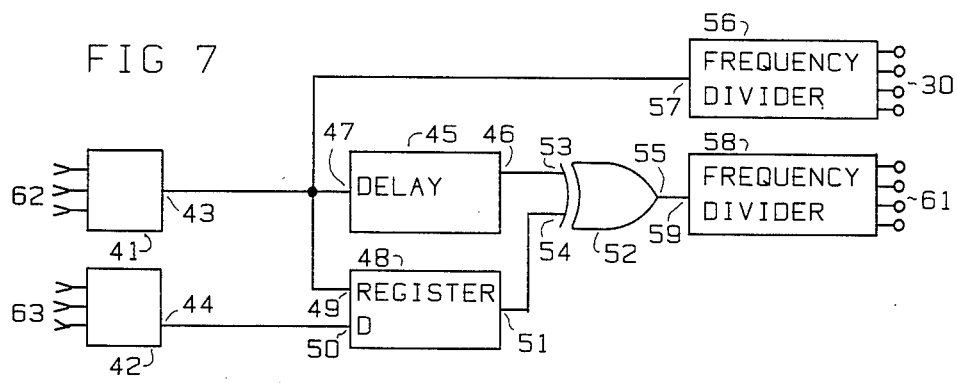
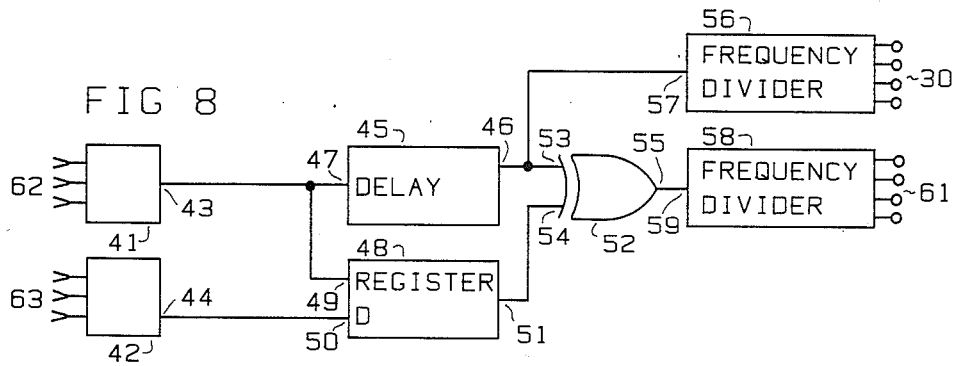
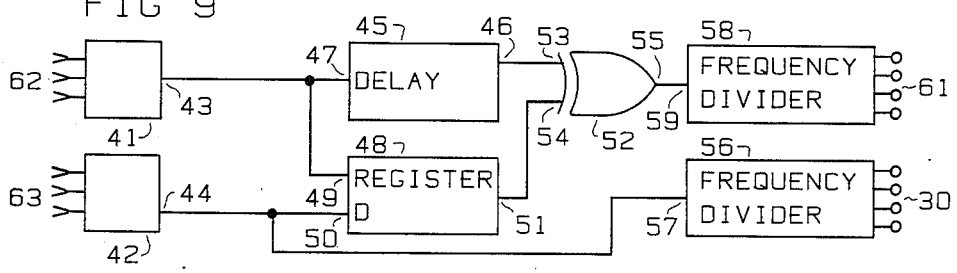
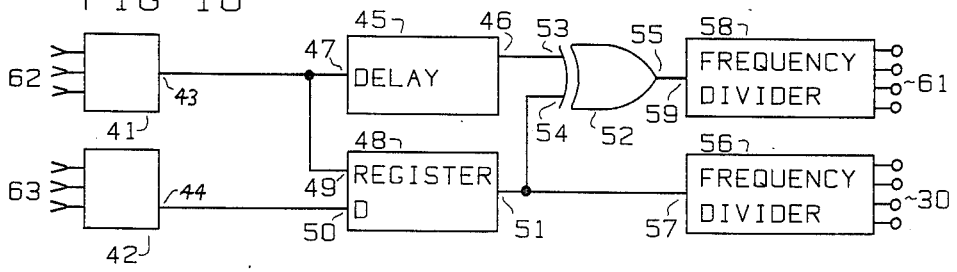

DIFFERENTIAL FREQUENCY SIGNAL GENERATOR

The present invention relates to electronic signal generation circuitry which produces signals differing in frequency by specific amounts.

Electronically generating two signals which differ in frequency by a stable amount can be difficult, especially if the difference in frequency between the two signals is small compared to the signal frequency. This difference in frequency will subsequently be referred to as the frequency difference.

Generation of such signals within the audio frequency range is of particular interest. Binaural beat signals, consisting of two sine wave signals of audible frequency with a frequency difference commonly in the range from 1 to 30 Hertz, are one example. Generating a series of signals with small frequency differences with respect to a harmonic series produces a series of inharmonic partials, useful in additive synthesis of complex waveforms.

When oscillators are tuned to provide such signals, the frequency differences are dependent on the stabilities of the oscillators relative to each other. Current technology provides very closely tracking oscillators which are very stable, but they require periodic adjustment to maintain accuracy. See my U.S. Pat. No. 4,575,688.

A digital frequency translation system, which provides signals whose frequency difference depends on the stability of only one oscillator, was described in my patent application filed 9/3/85 entitled Differential Frequency Signal Generator, Ser. No. 06/772,265—now abandoned. The system described therein has a shortcoming which adversely affects frequency difference stability.

An improved digital frequency translation system is disclosed as the present invention. While the present invention was developed to produce signals of audible frequency, said present invention is also useful at signal frequencies above the audio range, and especially well suited to signal frequencies below the audio range, and can be configured to provide signals of many different waveforms.

SUMMARY OF THE INVENTION

The present invention comprises digital logic state registers, signal delay means, EXCLUSIVE OR gates and digital frequency divider circuits, configured such that signals differing in frequency by stable, specific amounts are provided.

The basic differential frequency signal generator (subsequently abbreviated DFSG) of the present invention comprises: a signal transition delay means, a logic state register means and an EXCLUSIVE OR (subsequently abbreviated XOR) gate configured such that a signal output by said XOR gate has a frequency equal to the sum of frequencies of signals provided by a first and a second signal source; and further comprises a first digital frequency divider circuit providing an output signal divided down in frequency with respect to a signal at the output of said XOR gate, and a second digital frequency divider circuit providing an output signal divided down in frequency with respect to a signal provided by one of said signal sources.

The frequency difference between a signal output by said XOR gate and a signal output by one of said signal sources is equal to the frequency of a signal output by the other of said signal sources, and therefore the frequency difference between said signals output by said digital frequency dividers is dependent on the frequency of a signal provided by one of said signal sources and on the amount of frequency division provided by said digital frequency dividers.

It is an object of the present invention to provide electronic circuitry which produces signals with frequency differences which are stable over very long periods of time without need for adjustment, and further, to provide such circuitry comprised of inexpensive, readily available components.

Further objects and advantages of the present invention will become apparent from a consideration of the drawings and ensuing description.

BRIEF DESCRIPTION OF THE DRAWINGS

FIG. 7 is a block diagram showing a second basic DFSG.

FIG. 8 is a block diagram showing an alternative connection of the circuit elements shown in FIG. 7.

FIG. 9 is a block diagram showing an alternative connection of the circuit elements shown in FIG. 7.

FIG. 10 is a block diagram showing an alternative connection of the circuit elements shown in FIG. 7.

DETAILED DESCRIPTION OF THE INVENTION

Figure 1:
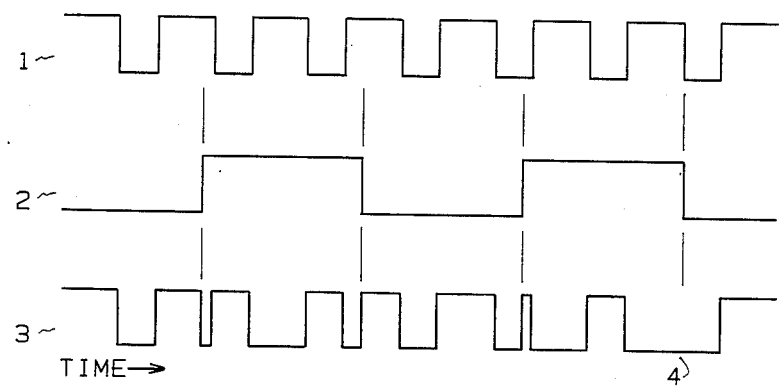
FIG. 1 is a timing diagram showing the circuit action of an XOR gate.

Direct current power supplies, necessary for operation of the circuitry but not essential to the discussion, are not shown in the figures in the drawings. Details of the various circuit elements are not shown in the figures as their functions are provided by well known circuitry.

Signal sources discussed can be any of many circuit elements commonly used in digital circuitry such as fixed or vaiable frequency oscillators, logic gates, flip flops, counters, buffers, etc.; and in some cases can be analog signal sources when such signal sources provide signals in an amplitude range compatible with circuit elements of the associated DFSG. 'Signal source' refers to any circuit element that can be thought of as sourcing signals to inputs of circuit elements connected to outputs of said signal sources. Said signal sources will commonly have inputs for receiving signals, but not always; for example a fixed frequency oscillator would have no such signal inputs. Outputs of said signal sources can be connected to circuitry other than that of the DFSG circuitry shown in the drawings.

Logic state registers used can be any of a variety of circuit elements which serve to store the state of a logic signal, and will subsequently be referred to simply as 'registers'. Outputs of said registers can be connected to circuitry other than that of the DFSG circuitry shown in the drawings.

Signal delay means used can be any of a variety of circuit elements which respond to state transitions of a first digital signal and provide a second signal with state transitions delayed with respect to state transitions of said first digital signal. A few examples are: monostable multivibrators, RC networks, cascaded buffers providing sufficient combined propagation delay, delay lines. Outputs of said delay means can be connected to circuitry other than that of the DFSG circuits shown in the drawings.

XOR gates used can consist of any combination of circuit elements which provide the EXCLUSIVE OR logic function. Outputs of said XOR gates can be connected to circuitry other than that of the DFSG circuitry shown in the drawings.

Digital frequency dividers used can be any of the various digital counter circuits such as toggle flip flops, binary ripple counters and synchronous walking ring counters, and will subsequently be referred to as 'frequency dividers'. Outputs of said frequency dividers can be connected to circuitry other than that of the DFSG circuitry shown in the drawings.

Figure 3:
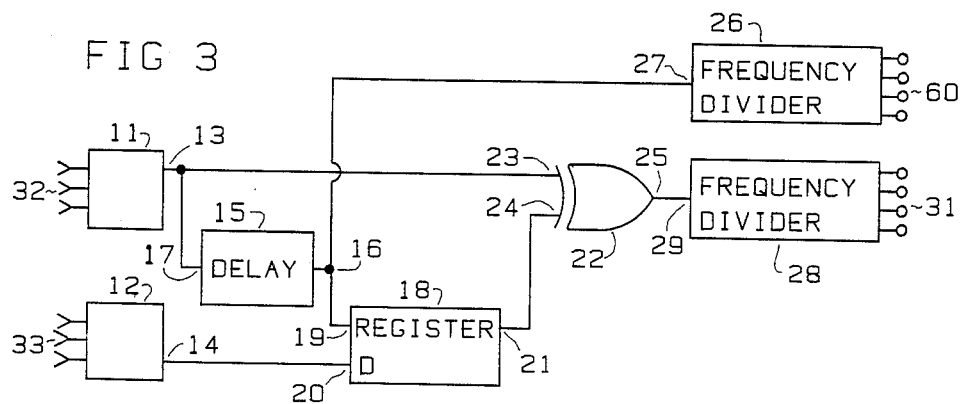
FIG. 3 is a block diagram showing an alternative connection of the circuit elements shown in FIG. 2.

FIG. 1 is a timing diagram illustrating the circuit action of an XOR gate. The horizontal axes of the three signal representations of FIG. 3 represent increasing time values from left to right, the time values being the same for all three signals represented. The vertical axes of the signal representations 1, 2 and 3 represent amplitide, showing the two possible digital states of said signals. Signal 3 shows the output of an XOR gate assuming that the signals represented by 1 and 2 are presented to the inputs of said XOR gate. Notice that the output of such an XOR gate changes state whenever an input to said XOR gate changes state, with the exception that the output of said XOR gate does not changes state if both signals present at inputs of said XOR gate change states simultaneously, or very nearly simultaneously, as shown at 4 in FIG. 1. Thus if the inputs to an XOR gate are not allowed to change state very nearly simultaneously, said XOR gate produces an output signal whose frequency is the sum of the frequencies of the two input signals of said XOR gate, since the number of state transitions occurring during a given period of time at the output of said XOR gate is equal to the combined number of state transitions presented to both of said XOR gate's inputs during said period of time. Notice, however, that the output signal of such an XOR gate will have positive going state transitions which are unequally spaced in time with respect to each other, and additionally, said signal will have negative going state transitions which are unequally spaced with respect to each other, as illustrated by signal representation 3 in FIG. 1. Said unequal time spacing of signal transitions will subsequently be called 'jitter' due to the appearance of such signals on an oscilloscope.

The various embodiments of the present invention utilize a signal delay means and a register to register state transitions of a first signal at times which do not coincide with state transitions of a second signal, and thus provide two signals to the inputs of an XOR gate, said signals having frequencies equal to the frequencies of said first and second signals, but having no coincident state transitions. Thus, an XOR gate is used to provide an output signal equal in frequency to the sum of the frequencies of two signals provided by two signal sources; the output signal of said XOR gate and a signal output by one of said signal sources have a frequency difference equal to the frequency of a signal provided by the other of said signal sources; and thus two signals are provided whose frequency difference is dependent on the frequency of a signal provided by only one signal source. Since an output signal from said XOR gate will have jitter as previously mentioned, such an output signal is not typically useful as is. If such signals are presented to an input of a frequency divider, an output signal produced by said frequency divider has a frequency divided by a given factor with respect to said signal applied to said frequency divider input, and also any jitter in said output signal is reduced by said given factor with respect to jitter on said input signal. Such jitter in a signal comprises generally unwanted harmonics, and thus in a DFSG circuit the amount of frequency division used is largely determined by the amount of acceptable distortion in a signal.

Figure 2:
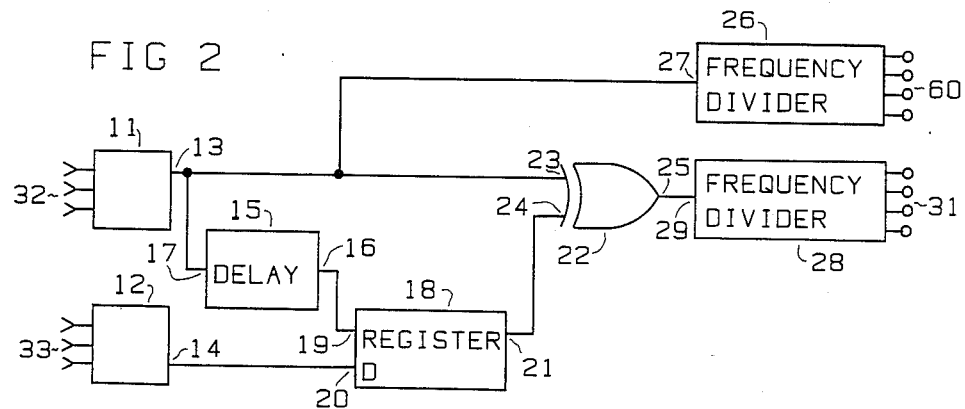
FIG. 2 is a block diagram of a first basic DFSG.

In FIG. 2 signal sources 11 and 12 have outputs 13 and 14, respectively, and optionally, inputs 32 and 33 respectively. The number of inputs 32 and 33 shown is arbitrary since the number of said inputs will depend on circuit details not dictated by the present invention. Delay means 15 has input 17 connected to signal source output 13; and output 16. Register 18 has input 19 connected to delay means output 16; data input 20 connected to signal source output 14; and output 21. Input 19 is a latch enable input when register 18 is a latch. Input 19 is a clock input when register 18 is a D type flip flop. XOR gate 22 has input 23 connected to signal source output 13; input 24 connected to register output 21; and output 25. Frequency divider 26 has input 27 connected to signal source output 13; and outputs 60. Frequency divider 28 has input 29 connected to XOR gate output 25; and outputs 31. The number of outputs 60 and 31 shown is arbitrary since the number of said outputs is not dictated by the present invention.

In FIG. 2, a signal from delay means output 16 has state transitions delayed with respect to state transitions of a signal at signal source output 13. Assuming a signal at signal source output 14 whose frequency is less than one half the frequency of a signal at signal source output 13, a signal is provided at register output 21 whose frequency (averaged over time) is equal to the frequency of the signal at signal source output 14, but whose state transitions occur only at times delayed with respect to state transitions of a signal at signal source output 13. When the frequency of the signal at signal source output 14 is equal to or greater than one half the frequency of the signal at output 13, some of the state changes of said signal at output 14 are not registered by register 18, and thus the frequency of a signal at register output 21 is limited to less than one half of the frequency of a signal at signal source output 13. A signal is provided at XOR gate output 25 whose frequency is equal to the sum of the frequencies of the signals present at signal source outputs 13 and 14 (assuming that the frequency of the signal at output 14 is less than one half the frequency of the signal at output 13). Signals are provided at outputs 60 and 31 whose frequency difference is a direct function of the frequency of the signal present at signal source output 14.

An alternative connection of the circuit elements of FIG. 2 is shown in FIG. 3 in which frequency divider input 27 is connected to delay means output 16.

Figure 4:
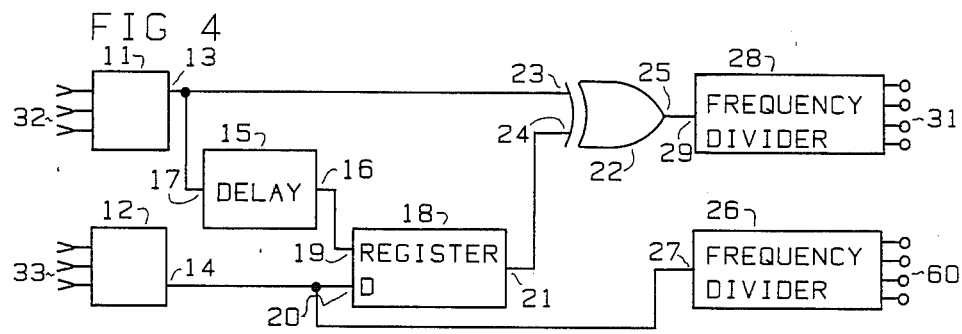
FIG. 4 is a block diagram showing an alternative connection of the circuit elements shown in FIG. 2.
Figure 5:
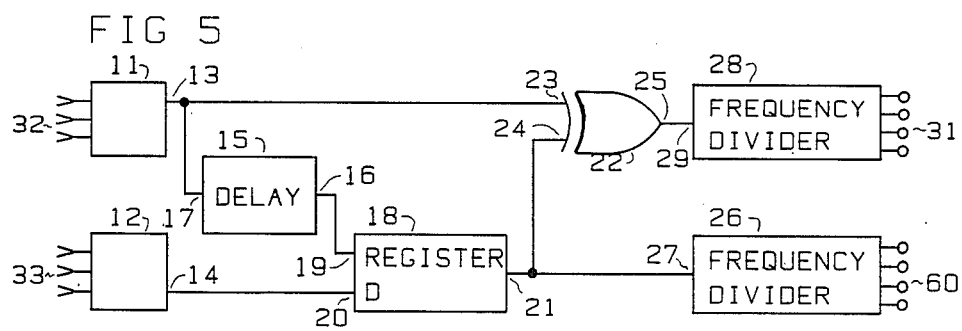
FIG. 5 is a block diagram showing an alternative connection of the circuit elements shown in FIG. 2.

A second alternative connection of the circuit elements of FIG. 2 is shown in FIG. 4 in which frequency divider input 27 is connected to signal source output 14. A third alternative connection of the circuit elements of FIG. 2 is shown in FIG. 5 in which frequency divider input 27 is connected to register output 21. With the second and third alternative connections, signals are provided at outputs 60 and 31 whose frequency difference is a direct function of the frequency of the signal present at signal source output 13.

Figure 6:
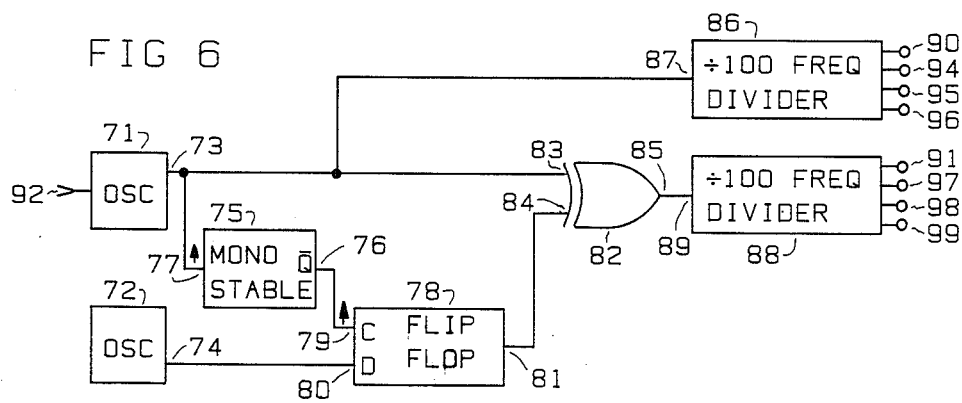
FIG. 6 is a block diagram showing a specific embodiment of a DFSG conforming to the configuration shown in FIG. 2.

FIG. 6 shows a specific embodiment of the invention, said embodiment conforming to the general configuration illustrated in FIG. 2. Signal source 71 is a voltage controlled oscillator having control voltage input 92 and output 73. Signal source 72 is a fixed frequency oscillator with output 74 and no inputs. Delay means 75 is a monostable multivibrator with positive edge triggered input 77 connected to oscillator output 73; and complimentary output 76. Register 78 is a D type flip flop with positive edge triggered clock input 79 connected to monostable output 76; data input 80 connected to oscillator output 74; and output 81. XOR gate 82 has input 83 connected to oscillator output 73; input 84 connected to flip flop output 81; and output 85. Divide-by-one-hundred frequency divider 86, comprising two cascaded divide-by-ten sychronous walking ring counters, has input 87 connected to oscillator output 73; and outputs 90, 94, 95 and 96. Divide-by-one-hundred frequency divider 88, comprising two cascaded divide-by-ten synchronous walking ring counters, has input 89 connected to XOR gate output 85; and outputs 91, 97, 98 and 99.

Complimentary output 76 of monostable 75 is normally at a high level until triggered by a positive going signal transition at input 77. Positive going transitions of the signal at oscillator or output 73 trigger monostable 75 which produces a low level pulse at output 76, said pulse having a positive going signal transition delayed with respect to the positive going signal transition which triggered said pulse. Positive going transitions of pulses from monostable 75 trigger flip flop 78, causing the level applied to input 80 to be registered at output 81 at the time of triggering, thus changes of state in the signal at oscillator output 74 are registered at flip flop output 81, delayed a short time with respect to the occurrence of positive going transitions of the signal at oscillator output 73. To insure that state transitions at output 81 do not coincide with any state transitions of the signal at oscillator output 73, the width of pulses produced by monostable 75 generally should be less than the time period between positive and negative transitions of the signal at oscillator output 73. Assuming a signal at oscillator output 74 whose frequency is less than one half the frequency of a signal at oscillator output 73, a signal is provided at XOR gate output 85, the frequency of which is equal to the sum of the frequencies of the signals at oscillator outputs 73 and 74, since transitions of the signal applied to XOR gate input 83 will not be coincident with any transitions of the signal applied to XOR gate input 84.

Letting the frequency of a signal at oscillator output 73 of FIG. 6 be equal to 100F, and the frequency of a signal at oscillator output 74 be equal to 100D, averaged over time the frequency of the signal at XOR gate output 85 will be 100F+100D, the frequency of the signals at frequency divider outputs 90, 94, 95 and 96 will be F, and the frequency of the signals at frequency divider outputs 91, 97, 98 and 99 will be F+D. The frequency difference between the signal at output 91 and the signal at output 90 is D, which is a direct function of the frequency of the signal at oscillator output 74, and thus said frequency difference is determined by only one oscillator, the stability of which can be made quite good over long periods of time even with inexpensive circuitry. In addition, the control voltage for oscillator 71 can be frequency modulated at a given frequency, causing the signals at outputs 90, 94, 95, 96, 91, 97, 98, and 99 to be frequency modulated at said given frequency while maintaining said frequency difference.

For binaural beat applications, the signals at outputs 90, 94, 95, 96, 91, 97, 98 and 99 are chosen to be square waves. Signals at outputs 90, 94, 95 and 96 are phase shifted with respect to each other. Signals at outputs 91, 97, 98 and 99 are phase shifted with respect to each other. Signals from outputs 90, 94, 95 and 96 can be summed together with resistive summing circuitry (not shown) producing a stepped approximation to a sine wave which is subsequently filtered to produce a low distortion sine wave, and signals from outputs 91, 97, 98 and 99 can be similarly processed by additional circuitry (not shown), thus producing two sine wave signals which have a stable frequency difference. Summing of the phase shifted outputs of frequency dividers 86 and 88 in various ways can provide a variety of simple or complex waveforms, and thus the number of phase shifted outputs (established by the length of the walking ring counter sequence) is determined by a specific application. The jitter of the signal at XOR gate output 85 comprises unwanted harmonics, and thus the amount of frequency division is largely determined by the acceptable amount of distortion in the signals at frequency divider outputs 91, 97, 98 and 99. For applications in which the operating frequency of oscillator 71 is made variable, tracking switched capacitor filters (not shown) are useful for filtering output signals and the output signal of oscillator 71 can be used as a clock signal for said switched capacitor filters. Alternatively, signals from some intermediate stages of the frequency divider chains can be used as clock signals for switched capacitor filters.

In FIG. 7 signal sources 41 and 42 have outputs 43 and 44, respectively; and, optionally, inputs 62 and 63, respectively. The number of inputs 62 and 63 shown is arbitrary since the number of said inputs will depend on circuit details not dictated by the present invention. Delay means 45 has input 47 connected to signal source output 43; and output 46. Register 48 has input 49, connected to signal source output 43; data input 50 connected to signal source output 44; and output 51. Input 49 is a latch enable input when register 48 is a latch. Input 49 is a clock input when register 48 is a D type flip flop. XOR gate 52 has input 53 connected to delay means output 46; input 54 connected to register output 51; and output 55. Frequency divider 56 has input 57 connected to signal source output 43; and outputs 30. Frequency divider 58 has input 59 connected to XOR gate output 55; and outputs 61. The number of outputs 30 and 61 shown is arbitrary since the number of said outputs is not dictated by the present invention.

In FIG. 7, a signal from delay means output 46 has state transitions delayed with respect to state transitions of a signal at signal source output 43. Assuming a signal at signal source output 44 whose frequency is less than one half the frequency of a signal at signal source output 43, a signal is provided at register output 51 whose frequency (averaged over time) is equal to the frequency of the signal at signal source output 44, but whose state transitions are coincident with state transitions of a signal at signal source output 43. When the frequency of the signal at signal source output 44 is equal to or greater than one half the frequency of the signal at signal source output 43, some of the state changes of said signal at output 44 are not registered by register 48, and thus the frequency of a signal at register output 51 is limited to less than one half of the frequency of a signal at signal source output 43. A signal is provided at XOR gate output 55 whose frequency is equal to the sum of the frequencies of the signals present at signal source outputs 43 and 44 (assuming that the frequency of the signal at output 44 is less than one half the frequency of the signal at output 43). Signals are provided at outputs 30 and 61 whose frequency difference is a direct function of the frequency of the signal present at signal source output 44.

An alternative connection of the circuit elements of FIG. 7 is shown in FIG. 8 in which frequency divider input 57 is connected to delay means output 46.

A second alternative connection of the circuit elements of FIG. 7 is shown in FIG. 9 in which frequency divider input 57 is connected to signal source output 44. A third alternative connection of the circuit elements of FIG. 7 is shown in FIG. 10 in which frequency divider input 57 is connected to register output 51. With the second and third alternative connections, signals are provided at outputs 30 and 61 whose frequency difference is a direct function of the frequency of the signal present at signal source output 43.

Figure 11:
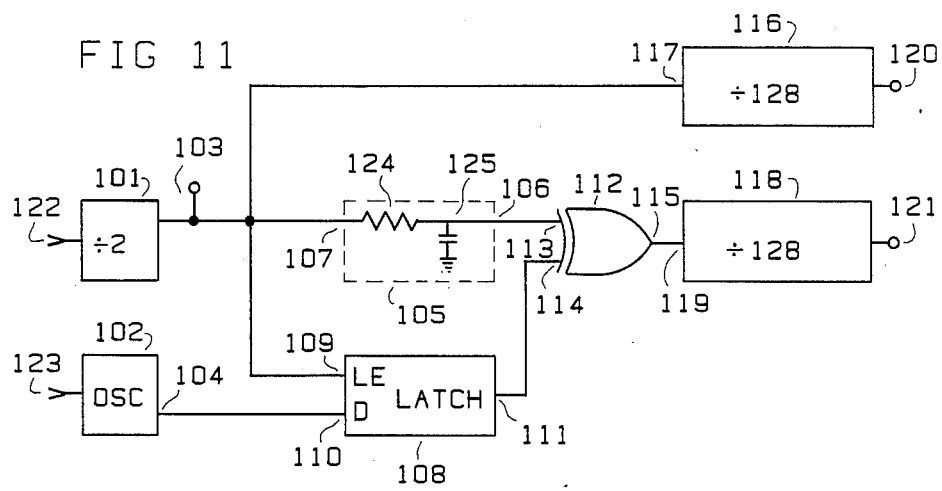
FIG. 11 is a block diagram showing a specific embodiment of a DFSG conforming to the configuration shown in FIG. 7.

FIG. 11 shows a specific embodiment of the invention, said embodiment conforming to the general configuration illustrated in FIG. 7. Signal source 101 is a divide-by-two frequency divider having input 122 and output 103. Signal source 102 is a voltage controlled oscillator having control voltage input 123 and output 104. Delay means 105, comprising resistance means 124 and capacitance means 125, has input 107 connected to frequency divider output 103; and output 106. Register 108 is a latch having latch enable input 109 connected to frequency divider output 103; data input 110 connected to oscillator output 104; and output 111. XOR gate 112 has input 113 connected to delay means output 106; input 114 connected to register output 111; and output 115. Frequency divider 116 is a divide-by-one-hundred-twenty-eight binary ripple counter having input 117 connected to frequency divider output 103; and output 120. Frequency divider 118 is a divide-by-one-hundred-twenty-eight binary ripple counter having input 119 connected to XOR gate output 115; and output 121.

In FIG. 11, delay means output 106 provides a signal with transitions delayed with respect to transitions of a signal provided by oscillator 101. Assuming a signal at oscillator output 104 whose frequency is less than one half the frequency of a signal at frequency divider output 103, latch 108 provides a signal at output 111 whose frequency (averaged over time) is equal to the frequency of a signal at oscillator output 104 and whose state transitions are coincident with state transitions of the signal at frequency divider output 103. XOR gate 112 provides a signal at output 115 whose frequency is equal to the sum of the frequencies of the signals present at frequency divider output 103 and oscillator output 104. Output signals, whose frequency difference is a direct function of the operating frequency of oscillator 102, are provided at outputs 120 and 121, and since oscillator 102 is variable, said frequency difference is variable.

For binaural beat applications, output signals at outputs 120 and 121 are chosen to be square waves, which are subsequently filtered to produce low distortion sine waves. The choice of output waveform depends on specific applications and the amount of frequency division is largely determined by the acceptable amount of distortion in the output signal at output 121.

A plurality of DFSG circuits, as heretofore described, are typically required for generation of complex signals. When a plurality of DFSG circuits are used, some circuit elements can be shared by several DFSG circuits.

Figure 12:
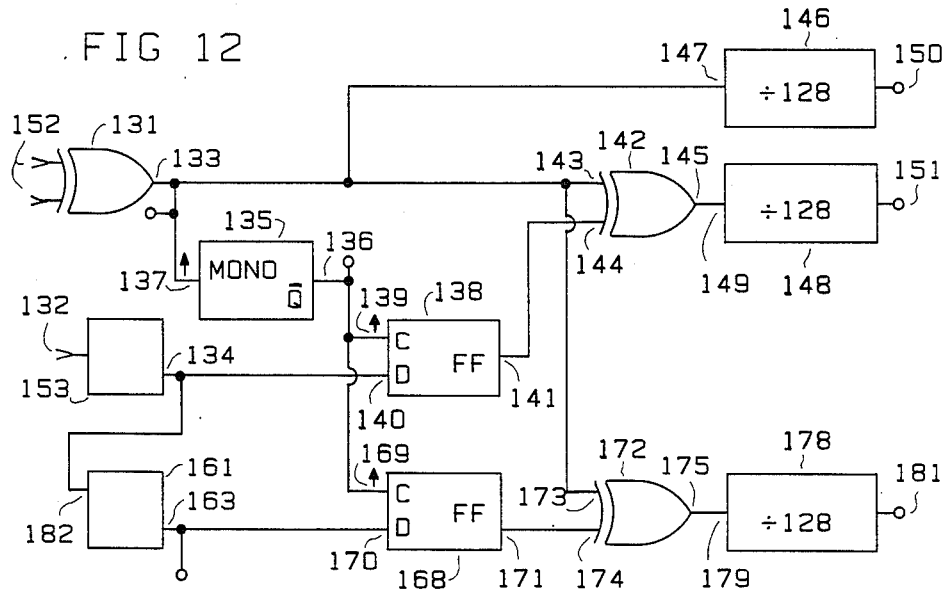
FIG. 12 is a block diagram of a signal generation system comprised of a plurality of basic DFSG circuits.

FIG. 12 shows a DFSG system comprising a plurality of basic DFSG circuits. Signal source 131 is an XOR gate with inputs 152 connected to external circuitry not shown; and output 133. Signal source 153 is a binary rate multiplier with input 132 connected to external circuitry not shown; and output 134. Signal source 161 is a binary rate multiplier with input 182 connected to rate multiplier output 134; and output 163. Delay means 135 is a positive transition triggered monostable multivibrator with trigger input 137 connected to XOR gate output 133; and complimentary output 136. Register 138 is a D type flip flop with positive transition triggered clock input 139 connected to monostable output 136; data input 140 connected to rate multiplier output 134; and output 141. Register 168 is a D type flip flop with positive transition triggered clock input 169 connected to monostable output 136; data input 170 connected to rate multiplier output 163; and output 171. XOR gate 142 has input 143 connected to XOR gate output 133; input 144 connected to flip flop output 141; and output 145. XOR gate 172 has input 173 connected to XOR gate output 133; input 174 connected to flip flop output 171; and output 175. Frequency divider 146 is a divide-by-one-hundred-twenty-eight binary ripple counter with input 147 connected to XOR gate output 133; and output 150. Frequency divider 148 is a divide-by-one-hundred-twenty-eight binary ripple counter with input 149 connected to XOR gate output 145; and output 151. Frequency divider 178 is a divide-by-one-hundred-twenty-eight binary ripple counter with input 179 connected to XOR gate output 175; and output 181.

FIG. 12 shows a system in which a first DFSG circuit comprises signal source 131, signal source 153, delay means 135, register 138, XOR gate 142, frequency divider 146 and frequency divider 148. A second DFSG circuit in the system of FIG. 12 comprises signal source 131, signal source 161, delay means 135, register 168, XOR gate 172, frequency divider 146 and frequency divider 181. Thus, signal source 131, delay means 135 and frequency divider 146 are shared by two DFSG circuits. More complex systems can be had by overlapping more DFSG circuits, thus providing a plurality of signals to be subsequently mixed, filtered and further mixed to form a complex signal comprising partials translated in frequency with respect to each other. Notice that signal source 131 and frequency divider 146 can be part of another DFSG, the remaining elements of which are not shown. Notice also that the DFSG system of FIG. 12 can be expanded by adding another partial DFSG circuit such that rate multiplier output 163 connects to an input of an additional rate multiplier not shown; monostable output 136 connects to a clock input of an additional flip flop not shown; and signal source output 133 connects to an input of an additional XOR gate not shown. In this manner, such a system can be expanded to produce complex signals with any desired number of partials. Subsequent mixing, filtering and further mixing of such signals is typically required to produce desired signals.

Figure 13:
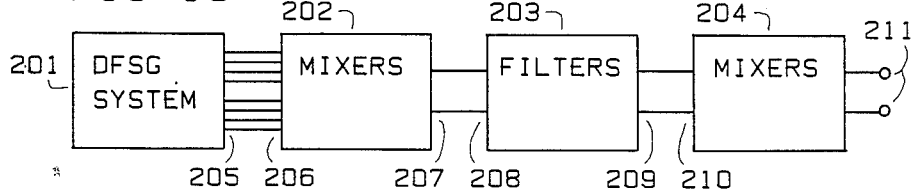
FIG. 13 is a block diagram showing a DFSG system combined with electronic mixing and filtering circuitry.

FIG. 13 shows a simple block diagram of a DFSG system 201 with outputs 205. Mixer circuitry 202 has inputs 206 connected to DFSG outputs 205; and outputs 207. Filter circuitry 203 has inputs 208 connected to mixer outputs 207; and outputs 209. Mixer circuitry 204 has inputs 210 connected to filter outputs 209; and outputs 211. The mixers 202 and 204 can be any combination of various active and/or passive circuit elements used to sum together a plurality of electronic signals. Filter circuitry 203 can be any of a variety of frequency sensitive circuitry used to filter electronic signals. The numbers of inputs and outputs shown in FIG. 13 are arbitrary, and only illustrate generally how a complete system would be configured. For audio applications, the number of outputs 211 will frequently be two for use in stereo and binaural systems.

Sometimes applications will not require both output signals from a DFSG circuit, but only a signal translated in frequency with respect to a signal input to said DFSG circuit. For such applications, only one frequency divider per basic DFSG circuit is required. Referring back to FIG. 2, an additional alternative circuit comprises the circuit elements of FIG. 2, but excluding frequency divider 26. Referring back to FIG. 7, an additional alternative circuit comprises the circuit elements of FIG. 7, but excluding frequency divider 56. Several such frequency translation circuits can be used to generate a series of inharmonic partials when inputs to said frequency translation circuits comprise a harmonic series.

The descriptions herein provide a small sampling of the many signal generation systems possible utilizing the differential frequency signal generating circuitry of the present invention. Choice of specific circuit elements is based on economy, availability and compatibility of circuit elements and should not be considered to be restricted to only those circuit elements mentioned in the foregoing description. Also, by overlapping of DFSG circuits in which circuit elements are shared by a plurality of DFSG circuits, many DFSG system configurations not described herein, but within the scope of the present invention, are possible. The scope of the present invention is indicated in the appended claims.

What is claimed is:

1. Electronic circuitry comprising
   a signal delay means having an input for receiving signals from a first signal source, and an output;
   a digital register means having a first input for receiving signals from said signal delay means output, a second input for receiving signals from a second signal source, and an output;
   an XOR gate having a first input for receiving signals from said first signal source, a second input for receiving signals from said digital register means output, and an output;
   a first digital frequency divider means having an input for receiving signals from said XOR gate output, and at least one output;
   and a second digital frequency divider means having an input for receiving signals from said first signal source, and at least one output.

2. Electronic circuitry comprising
   a signal delay means having an input for receiving signals from a first signal source, and an output;
   a digital register means having a first input for receiving signals from said signal delay means output, a second input for receiving signals from a second signal source, and an output;
   an XOR gate having a input for receiving signals from said first signal source, a second input for receiving signals from said digital register means output, and an output;
   a first digital frequency divider means having an input for receiving signals from said XOR gate output, and at least one output;
   and a second digital frequency divider means having an input for receiving signals from said signal delay means output, and at least one output.

3. Electronic circuitry comprising
   a signal delay means having an input for receiving signals from a first signal source, and an output;
   a digital register means having a first input for receiving signals from said signal delay means output, a second input for receiving signals from a second signal source, and an output;
   an XOR gate having a first input for receiving signals from said first signal source, a second input for receiving signals from said digital register means output, and an output;
   a first digital frequency divider means having an input for receiving signals from said XOR gate output, and at least one output;
   and a second digital frequency divider means having an input for receiving signals from said second signal source, and at least one output.

4. Electronic circuitry comprising
   a signal delay means having an input for receiving signals from a first signal source, and an output;
   a digital register means having a first input for receiving signals from said signal delay means output, a second input for receiving signals from a second signal source, and an output;
   an XOR gate having a first input for receiving signals from said first signal source, a second input for receiving signals from said digital register means output, and an output;
   a first digital frequency divider means having an input for receiving signals from said XOR gate output, and at least one output;
   and a second digital frequency divider means having an input for receiving signals from said digital register means output, and at least one output.

5. Electronic circuitry comprising
   a signal delay means having an input for receiving signals from a first signal source, and an output;
   a digital register means having a first input for receiving signals from said signal delay means output, a second input for receiving signals from a second signal source, and an output;
   an XOR gate having a first input for receiving signals from said first signal source, a second input for receiving signals from said digital register means output, and an output;
   and a digital frequency divider means having an input for receiving signals from said XOR gate output, and at least one output.

6. Electronic circuitry comprising
   a signal delay means having an input for receiving signals from a first signal source, and an output;

a digital register means having a first input for receiving signals from said first signal source, a data input for receiving signals from a second signal source, and an output;

an XOR gate having a first input for receiving signals from said signal delay means output, a second input for receiving signals from said digital register means output, and an output;

a first digital frequency divider means having an input for receiving signals from said XOR gate output, and at least one output;

and a second digital frequency divider means having an input for receiving signals from said first signal source, and at least one output.

7. Electronic circuitry comprising a signal delay means having an input for receiving signals from a first signal source, and an output;

a digital register means having a first input for receiving signals from said first signal source, a data input for receiving signals from a second signal source, and an output;

an XOR gate having a first input for receiving signals from said signal delay means output, a second input for receiving signals from said digital register means output, and an output;

a first digital frequency divider means having an input for receiving signals from said XOR gate output, and at least one output;

and a second digital frequency divider means having an input for receiving signals from said signal delay means output, and at least one output.

8. Electronic circuitry comprising a signal delay means having an input for receiving signals from a first signal source, and an output;

a digital register means having a first input for receiving signals from said first signal source, a data input for receiving signals from a second signal source, and an output;

an XOR gate having a first input for receiving signals from said signal delay means output, a second input for receiving signals from said digital register means output, and an output;

a first digital frequency divider means having an input for receiving signals from said XOR gate output, and at least one output;

and a second digital frequency divider means having an input for receiving signals from said second signal source, and at least one output.

9. Electronic circuitry comprising a signal delay means having an input for receiving signals from a first signal source, and an output;

a digital register means having a first input for receiving signals from said first signal source, a data input for receiving signals from a second signal source, and an output;

an XOR gate having a first input for receiving signals from said signal delay means output, a second input for receiving signals from said digital register means output, and an output;

a first digital frequency divider means having an input for receiving signals from said XOR gate output, and at least one output;

and a second digital frequency divider means having an input for receiving signals from said digital register means output, and at least one output.

10. Electronic circuitry comprising a signal delay means having an input for receiving signals from a first signal source, and an output;

a digital register means having a first input for receiving signals from said first signal source, a data input for receiving signals from a second signal source, and an output;

an XOR gate having a first input for receiving signals from said signal delay means output, a second input for receiving signals from said digital register means output, and an output;

and a digital frequency divider means having an input for receiving signals from said XOR gate output, and at least one output.

* * * * *